United States Patent
Padmanabhan et al.

(10) Patent No.: US 8,288,834 B1
(45) Date of Patent: Oct. 16, 2012

(54) SEMICONDUCTOR WAFER AND DIE THAT INCLUDE AN INTEGRATED CIRCUIT AND TWO OR MORE DIFFERENT MEMS-BASED SEMICONDUCTOR DEVICES

(75) Inventors: Gobi R. Padmanabhan, Sunnyvale, CA (US); Visvamohan Yegnashankaran, Redwood City, CA (US)

(73) Assignee: Texas Instruments Incorporated, Dallas, TX (US)

( * ) Notice: Subject to any disclaimer, the term of this patent is extended or adjusted under 35 U.S.C. 154(b) by 669 days.

(21) Appl. No.: 12/002,486

(22) Filed: Dec. 17, 2007

Related U.S. Application Data

(62) Division of application No. 10/894,846, filed on Jul. 20, 2004, now Pat. No. 7,329,555.

(51) Int. Cl.
*H01L 27/088* (2006.01)
(52) U.S. Cl. .... 257/414; 257/419; 257/724; 257/E23.01
(58) Field of Classification Search .......... 257/414–420, 257/723, 724, E23.01
See application file for complete search history.

(56) References Cited

U.S. PATENT DOCUMENTS

| 6,126,311 A | 10/2000 | Schuh ............................. 374/21 |
| 6,495,388 B1 | 12/2002 | Ismail ............................. 438/53 |
| 6,686,225 B2 | 2/2004 | Wachtler ....................... 438/114 |
| 6,797,534 B1 | 9/2004 | Tu et al. .......................... 438/48 |
| 7,012,339 B2 | 3/2006 | Terui ............................. 257/786 |
| 2004/0188795 A1* | 9/2004 | Ohkubo et al. ............... 257/467 |
| 2005/0101059 A1* | 5/2005 | Yang ............................ 438/127 |

OTHER PUBLICATIONS

U.S. Appl. No. 12/012,838, filed Dec. 10, 2001, Yegnashankaran, et al.

* cited by examiner

*Primary Examiner* — Thanhha Pham
(74) *Attorney, Agent, or Firm* — Alan A.R. Cooper; Wade James Brady, III; Frederick J. Telecky, Jr.

(57) ABSTRACT

Various semiconductor devices can be formed at the end of a common fabrication process, thereby significantly improving manufacturing flexibility, by selectively wiring bonding different CMOS circuits to different MEMS, which are formed on the same semiconductor die. A semiconductor device that has a number of CMOS circuits and a number of MEMS is formed on the same semiconductor wafer in adjacent regions on the wafer, and then diced such that the CMOS circuits and the MEMS are formed on the same die. After dicing, different CMOS circuits and different MEMS can be selectively connected during the wire bonding step to form the different semiconductor devices.

15 Claims, 2 Drawing Sheets

SEMICONDUCTOR WAFER AND DIE THAT INCLUDE AN INTEGRATED CIRCUIT AND TWO OR MORE DIFFERENT MEMS-BASED SEMICONDUCTOR DEVICES

This is a divisional application of application Ser. No. 10/894,846 filed on Jul. 20, 2004, now U.S. Pat. No. 7,329,555, issued on Feb. 12, 2008.

BACKGROUND OF THE INVENTION

1. Field of the Invention

The present invention relates to a semiconductor devices and, more particularly, to a semiconductor wafer and die that include an integrated circuit and two or more different MEMS-based semiconductor devices.

2. Description of the Related Art

To fabricate conventional analog and digital CMOS semiconductor chips, the same fabrication steps are performed to each of a large number of integrated circuit surface regions that are located on the top surface of a CMOS semiconductor wafer. The fabrication steps, in turn, form a corresponding number of identical CMOS structures, which each realize identical CMOS circuits, on the top surface of the semiconductor wafer.

FIG. 1A shows a plan view that illustrates a prior-art semiconductor wafer 100. FIG. 1B shows an exploded view of a portion of the top surface of semiconductor wafer 100. As shown in FIGS. 1A and 1B, wafer 100 has a large number of spaced-apart, integrated circuit surface regions 110 that are arranged in rows and columns.

In addition, as further shown in FIG. 1B, a large number of CMOS structures 112, which each realize identical CMOS circuits, are formed on the top surface of wafer 100 so that a CMOS structure 112 is formed in each integrated circuit surface region 110. Further, each CMOS structure 112 includes a large number of electrical pads 114 that are connected to the CMOS circuit, and encircle the periphery of integrated circuit surface region 110 and CMOS structure 112.

Once the CMOS structures have been formed, CMOS semiconductor wafer 100 is diced or cut along each of a large number of horizontal and vertical streets 116H and 116V that separate the integrated circuit surface regions 110 from each other to form a large number of dice. Each individual die is then placed in a package, such as a flip-chip package when the die has been bumped, to form a CMOS semiconductor chip.

A micro-electromechanical system (MEMS) is a microscopic machine that is fabricated using the same types of steps (e.g., the deposition of layers of material and the selective removal of the layers of material) that are used to fabricate conventional analog and digital CMOS circuits.

For example, a MEMS can realize a pressure sensor by using a diaphragm with a number of piezoresistors. In operation, when the pressure changes, the change in pressure changes the strain placed on the piezoresistors. The change in strain deforms the band gap structures of the piezoresistors. The deformed band gap structures change the mobility and density of the charge carriers which, in turn, changes the resistivity. The changes in resistivity are detected by a Wheatstone Bridge, which varies the output voltage VO in response to the changes in resistivity. Other examples of MEMS include microphones, joysticks, and temperature sensors.

As with the CMOS devices, MEMS devices are formed by performing the same fabrication steps to each of a large number of MEMS regions that are located on the top surface of a MEMS semiconductor wafer. The fabrication steps form a corresponding number of identical MEMS structures, which each realize identical MEMS functions, on the top surface of the MEMS semiconductor wafer. The MEMS semiconductor wafer is then diced to form a large number of dice. Each individual die is then placed in a package to form a MEMS semiconductor chip.

A MEMS semiconductor chip is often placed adjacent to a CMOS semiconductor chip on a printed circuit board so that the MEMS semiconductor chip can be electrically connected to the CMOS semiconductor chip to provide the MEMS functionality to the CMOS semiconductor chip.

For example, when electrically connected together, the MEMS semiconductor chip can provide MEMS signals which indicate changing physical conditions, such as changes in pressure, while the CMOS semiconductor chip can process the MEMS signals to provide useful information.

Although the use of adjacent CMOS and MEMS semiconductor chips provides satisfactory performance, the use of two separate chips consumes a significant amount of printed circuit board area. One approach to solving this problem is to mount the MEMS semiconductor chip on a central area of the top surface of an underlying CMOS semiconductor chip.

One drawback of this approach, however, is that the top surface of the CMOS semiconductor chip must be large enough to accommodate the footprint of the MEMS semiconductor chip. Although some CMOS chips are quite large, such as microprocessor chips, this is not the case for all CMOS chips. Thus, there is a need for additional methods of reducing the amount of printed-circuit-board surface area consumed by adjacent CMOS and MEMS semiconductor chips.

DETAILED DESCRIPTION OF THE INVENTION

Figure 2:
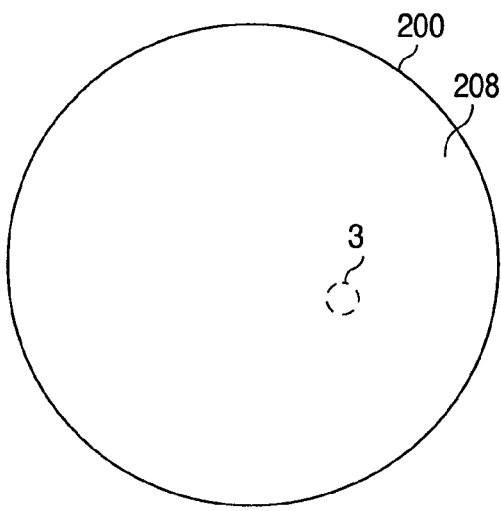
FIG. 2 is a plan view illustrating an example of a semiconductor wafer 200 in accordance with the present invention.

FIG. 2 shows a plan view that illustrates an example of a semiconductor wafer 200 in accordance with the present invention. FIGS. 3A-3D show a series of exploded views of a portion of the top surface of semiconductor wafer 200 that illustrates an example of a method of forming a semiconductor device in accordance with the present invention.

As described in greater detail below, the method of the present invention sequentially forms a number of CMOS MEMS support circuits and a number of MEMS on the same semiconductor wafer in adjacent regions on the wafer, and then dices the wafer such that the CMOS MEMS support circuits and the MEMS are formed on the same die. Different devices are then defined during the wire bonding step by selectively connecting the CMOS MEMS support circuits and MEMS devices together.

Figure 1B:
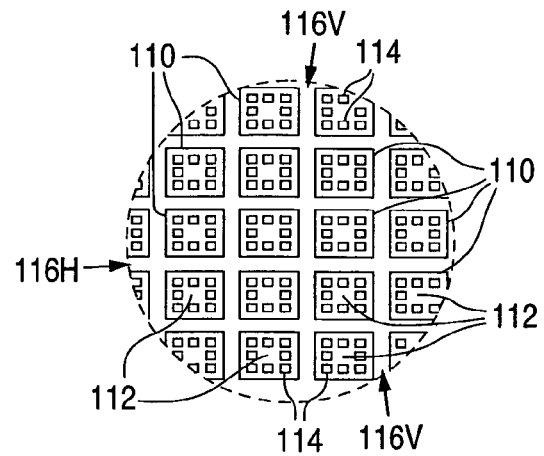
FIG. 1B is an exploded view of a portion of the top surface of semiconductor wafer 100.
Figure 1A:
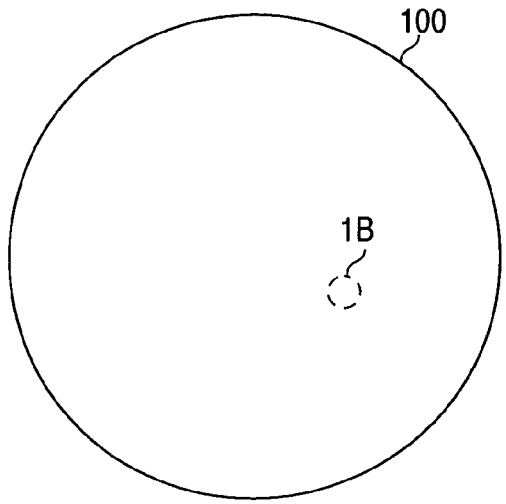
FIG. 1A is a plan view illustrating a prior-art semiconductor wafer 100.
Figure 3A:
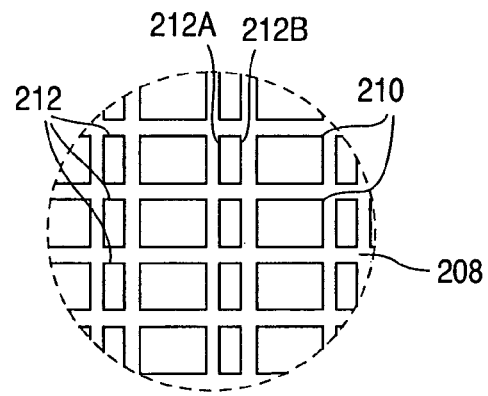
FIGS. 3A-3D are a series of exploded views of a portion of the top surface of semiconductor wafer 200 illustrating an example of a method of forming a semiconductor device in accordance with the present invention.

As shown in FIGS. 2 and 3A, semiconductor wafer 200, which is conventionally formed, has a top surface 208 that includes a number of integrated circuit surface regions 210, and a number of MEMS surface regions 212 such that each integrated circuit surface region 210 contacts a MEMS surface region 212. In the example, the MEMS surface regions 212 are smaller than the integrated circuit surface regions 210, although the two regions can have any relative size. In addition, each MEMS surface region 212 has a first side 212A and a spaced-apart second side 212B that lies parallel to the first side 212A.

Figure 3B:
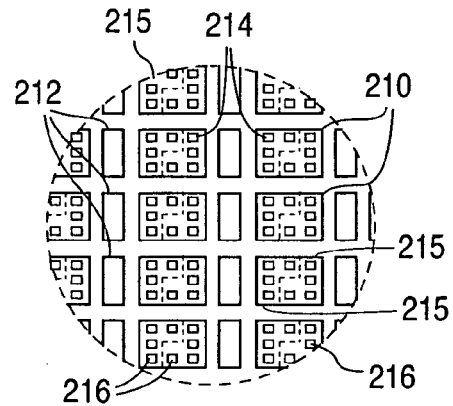

As shown in FIG. 3B, the method begins by forming an integrated circuit 214 on each of the integrated circuit surface regions 210 of semiconductor wafer 200. (The integrated circuits 214 on the surface regions 210 are formed at the same time using conventional fabrication steps.)

Each integrated circuit 214 includes a large number of transistors that are formed in and on semiconductor wafer 200 to provide a number of CMOS MEMS support circuits 215, and a conductive interconnect structure that is formed on wafer 200 to electrically contact the transistors. The conductive interconnect structure includes a number of layers of metal traces that electrically contact the transistors.

Further, as shown in the example, each integrated circuit 214 includes a number of pads 216 that are formed around the periphery of the corresponding integrated circuit surface region 210 and integrated circuit 214 formed on region 210 to be electrically connected to the transistors on wafer 200 via the conductive interconnect structure.

Figure 3C:
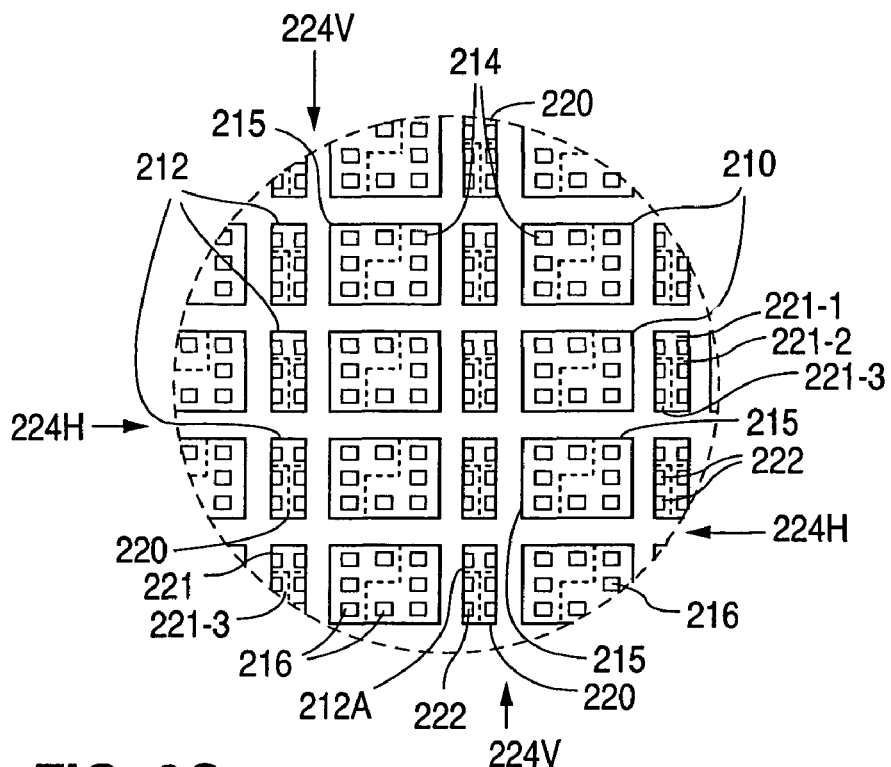

Next, as shown in FIG. 3C, the method continues by forming a MEMS device 220 on each of the MEMS surface regions 212. (The MEMS devices 220 on the surface regions 212 are formed at the same time using conventional fabrication steps.) As further shown in FIG. 3C, each MEMS device 220 includes a number of different MEMS sensors 221, such as a pressure sensor 221-1, a microphone 221-2, and a temperature sensor 221-3. Each MEMS sensor 221 varies a value, such as resistance or capacitance, in response to changes in an external physical condition, such as pressure or temperature.

In addition, each MEMS device 220 includes a number of pads 222 that are formed adjacent to the first side 212A to be electrically connected to variable structures, such as a diaphragm, on device 220. Further, in the present example, MEMS device 220 has electrical pads formed adjacent to the sides, although pads can alternately be formed adjacent to less than all of the sides.

Figure 3D:
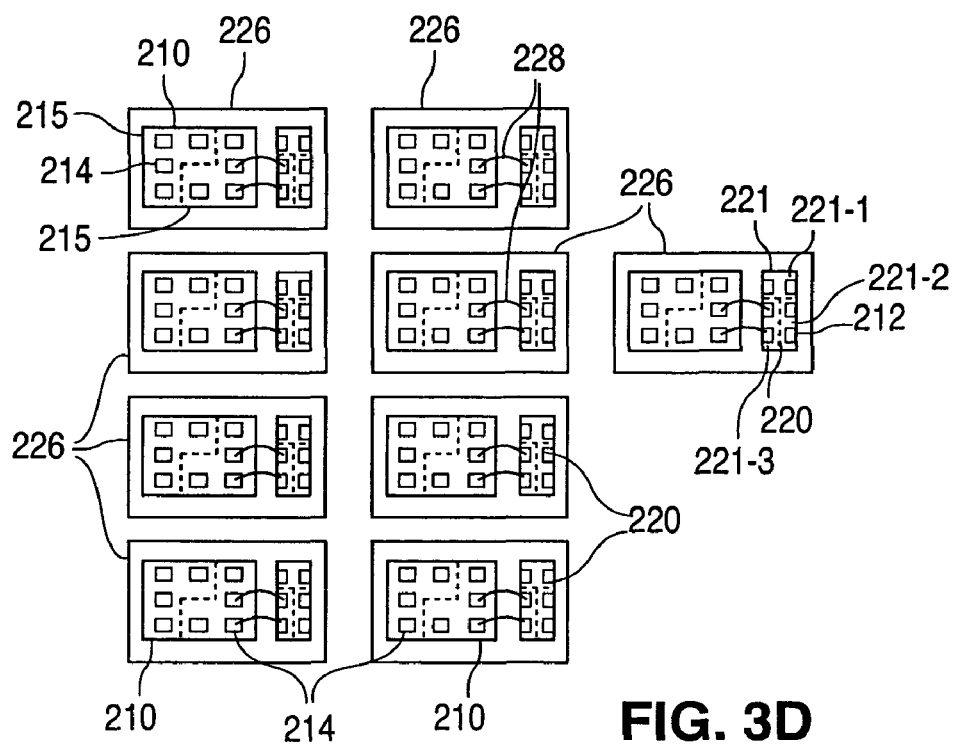

Following this, as shown in FIG. 3D, the method continues by dicing semiconductor wafer 200 along a large number of horizontal and vertical streets 224H and 224V that separate the integrated circuit surface regions 210 and the MEMS surface regions 212 from each other to form a large number of dice 226.

In accordance with the present invention, each horizontal street 224H is cut, while only every other vertical street 224V is cut so that each die has an integrated circuit 214 that is formed on an integrated circuit surface region 210, and a MEMS device 220 that is formed on a MEMS surface region 212. After semiconductor wafer 200 has been diced, bonding wires 228 are used to connect the bonding pads on the MEMS device 220 to the bonding pads on the integrated circuit 214.

In further accordance with the present invention, the bonding wires 228 can be selectively connected between the different CMOS MEMS support circuits 215 of integrated circuit 214 and the different MEMS sensors 221 of MEMS device 220. For example, in a first wafer set, the bonding wires can be connected to pressure sensor circuitry in integrated circuit 214 and only the pressure sensors on MEMS device 220.

Similarly, in a second wafer set, the bonding wires can be connected to pressure sensor circuitry in integrated circuit 214 and only the microphone on MEMS device 220. This select formation of bonding wires provides enormous manufacturing flexibility in that the same product can be manufactured using a common fabrication process, and then differentiated into a number of different products at the final stage of device assembly during wire bonding.

Another advantage of the present invention is that the present invention reduces the printed circuit board footprint. Since integrated circuit 214 and MEMS device 220 are formed on the same wafer and die, integrated circuit 214 and MEMS device 220 can be packaged together. The packages that carry the die often have die attachment locations that are significantly larger than the footprint of the die.

Thus, even though a die that has both integrated circuit 214 and MEMS device 220 is larger than a die that has only an integrated circuit, a die that has both integrated circuit 214 and MEMS device 220 can often be placed in the same size package that would carry a die that has only an integrated circuit.

In these instances, the present invention substantially reduces the amount of printed-circuit-board surface area that is consumed by adjacent CMOS and MEMS semiconductor chips by effectively eliminating the area consumed by the MEMS semiconductor chip. Even when a CMOS package can not accommodate a die that has both integrated circuit 214 and MEMS device 220, the package need only be modestly increased in size. Thus, the present invention provides a reduction in the printed-circuit-board surface area that is required.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A semiconductor die comprising:
    a single piece of semiconductor material having a top surface that includes an integrated circuit surface region and a MEMS surface region that lies adjacent to the integrated circuit surface region;
    an integrated circuit that touches the single piece of semiconductor material in the integrated circuit surface region;
    two or more MEMS structures that touch the single piece of semiconductor material in the MEMS surface region, the two or more MEMS structures being different; and
    a number of bonding wires electrically connected to the integrated circuit, and electrically connected to only one of the two or more MEMS structures.

2. The semiconductor die of claim 1 wherein one or more of the MEMS structures is connected to no bonding wires.

3. The semiconductor die of claim 1 wherein the integrated circuit includes a number of MEMS support circuits.

4. The semiconductor die of claim 3 wherein the two or more MEMS structures are MEMS sensors.

5. A semiconductor die comprising:
    a single piece of semiconductor material having a top surface that includes an integrated circuit surface region and a MEMS surface region;
    an integrated circuit that touches the single piece of semiconductor material in the integrated circuit surface region; and
    two or more MEMS structures that touch the single piece of semiconductor material in the MEMS surface region, only one of the two or more MEMS structures being electrically connected to the integrated circuit.

6. The semiconductor die of claim 5 wherein the two or more MEMS structures are different.

7. The semiconductor die of claim 6 wherein the two or more MEMS structures are MEMS sensors.

8. The semiconductor die of claim 7 wherein the integrated circuit includes a number of MEMS support circuits.

9. The semiconductor die of claim 8 and further comprising bonding wires that electrically connect the integrated circuit to said only one of the two or more MEMS structures.

10. A semiconductor structure comprising:
a semiconductor substrate having a top surface;
an integrated circuit having a number of transistors formed in the semiconductor substrate, and a plurality of pads electrically connected to the transistors, the top surface of the semiconductor substrate being spaced apart from and lying below the plurality of pads; and
a MEMS device that touches the top surface of the semiconductor substrate, the MEMS device having two or more MEMS structures
wherein only one integrated circuit is located in and on the semiconductor substrate, and
wherein the integrated circuit and the MEMS device are separated by a single saw street surface region of the top surface of the semiconductor substrate.

11. The semiconductor structure of claim 10 wherein no MEMS structure lies directly vertically over the integrated circuit.

12. The semiconductor structure of claim 10 wherein the two or more MEMS structures are different.

13. The semiconductor structure of claim 12 wherein only one of the two or more MEMS structures are electrically connected to the integrated circuit.

14. The semiconductor structure of claim 12 wherein the MEMS device is selectively electrically connected to the integrated circuit to form only one of two or more different products.

15. The semiconductor structure of claim 14 wherein each of the two or more different products includes a structure from the two or more MEMS structures.

* * * * *